United States Patent
Maruyama

(10) Patent No.: US 7,683,814 B2
(45) Date of Patent: Mar. 23, 2010

(54) CONSTANT CURRENT SOURCE, RAMP VOLTAGE GENERATION CIRCUIT, AND A/D CONVERTER

(75) Inventor: Masahiko Maruyama, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 1 day.

(21) Appl. No.: 12/019,497

(22) Filed: Jan. 24, 2008

(65) Prior Publication Data

US 2009/0079603 A1    Mar. 26, 2009

(30) Foreign Application Priority Data

Jan. 30, 2007    (JP) .............................. 2007-018973

(51) Int. Cl.
    *H03M 1/10*    (2006.01)
(52) U.S. Cl. ...................... 341/121; 341/155
(58) Field of Classification Search ................ 341/121, 341/120, 155, 161, 169; 348/308
See application file for complete search history.

(56) References Cited

U.S. PATENT DOCUMENTS

| | | | |
|---|---|---|---|
| 4,257,034 A * | 3/1981 | Wilkinson | 341/118 |
| 5,774,733 A * | 6/1998 | Nolan et al. | 713/300 |
| 7,408,138 B2 * | 8/2008 | Lee | 250/208.1 |
| 2006/0001476 A1 | 1/2006 | Yanagisawa et al. | |

FOREIGN PATENT DOCUMENTS

| | | | |
|---|---|---|---|
| JP | 63-91720 A | | 4/1988 |
| JP | 2000-286706 A | | 10/2000 |
| JP | 2003-60507 A | | 2/2003 |
| JP | 2006-18663 A | | 1/2006 |

* cited by examiner

*Primary Examiner*—Rexford N Barnie
*Assistant Examiner*—Joseph Lauture
(74) *Attorney, Agent, or Firm*—Birch, Stewart, Kolasch & Birch LLP

(57) ABSTRACT

A ramp voltage generation circuit suitable for an A/D converter preventing a variation in a digital value obtained by an A/D conversion operation. The circuit comprises a stabilization voltage source Vref, an operation amplifier AMP1 having a non-inversion input terminal receiving a voltage $V_{REF}$ from the Vref and an inversion input terminal connected to a switched capacitor equivalent resistance Req, and a transistor MNSF for conducting a current Ick to the Req based on an output voltage of the AMP1. Both ends of a conductive load Cint charged and discharged based on a current Iint2 generated by a current mirror of the Ick are connected to an output terminal and an inversion input terminal of an operation amplifier AMPint, a voltage of a stabilization voltage source Vc is applied to a non-inversion input terminal, and an output voltage of the AMPint is outputted to the outside as a ramp voltage.

8 Claims, 16 Drawing Sheets

US 7,683,814 B2

CONSTANT CURRENT SOURCE, RAMP VOLTAGE GENERATION CIRCUIT, AND A/D CONVERTER

CROSS REFERENCE TO RELATED APPLICATION

This Nonprovisional application claims priority under 35 U.S.C. §119(a) on Patent Application No. 2007-018973 filed in Japan on 30 Jan. 2007 the entire contents of which are hereby incorporated by reference.

BACKGROUND OF THE INVENTION

1. Field of the Invention

The present invention relates to an A/D (analog-digital) converter in which one or more analog voltages to be converted are sampled and held and the sampled and held one or more analog voltages to be converted are compared with a reference voltage given by a voltage change value of a ramp voltage having a voltage value changing monotonically for a certain period or a voltage value proportional to the voltage change value, and each of the one or more analog voltages to be converted is converted to a digital value corresponding to the reference voltage and outputted, and more particularly, to a column-type A/D converter. Particularly, the present invention relates to a ramp voltage generation circuit and a constant current source suitable for the above column-type A/D converter.

2. Description of the Related Art

Recently, high speed and low power consumption are increasingly demanded in an A/D converter used in a solid-state image sensor. In order to satisfy the above demand, a column-type A/D converter is used in many cases (refer to Japanese Unexamined Patent Publication No. 2000-286706).

FIG. 11 is a circuit block diagram showing a schematic constitution of a conventional column-type A/D converter. A column-type A/D converter 51 comprises an inverter circuit 12, a switch RS to short-circuit an input node CPI and an output node CPO of the inverter circuit 12, a capacitor CT to sample an analog voltage to be converted, a ramp voltage generation circuit 50 generating a ramp voltage $V_{RAMP}$ changing its value monotonically for a certain period, a capacitor CR and a switch S3 to transmit the ramp voltage $V_{RAMP}$ to the input node CPI, a counter 15 counting a digital value (n-bit binary signal) according to the voltage value change of the ramp voltage and outputting it, a switch SS to sample the analog voltage to be converted, and a latch circuit 13 to latch a counter output corresponding to the analog voltage to be converted as circuit elements. Furthermore, in FIG. 11, a pixel part 16 of a solid-state image sensor outputting a voltage corresponding to an incident light amount, to the column-type A/D converter 51, and a constant current source Ix to lead the voltage based on the electric charge amount generated by the photoelectric conversion at the pixel part 16, to the node VIN are also illustrated.

The A/D conversion operation of the column-type A/D converter 51 will be described with reference to a timing chart shown in FIG. 12.

At a timing t1, when a switch RX of the pixel part 16 is turned on, a node FD is reset to a voltage $V_{DD}$, a node VIN is charged to a high potential through a MOS transistor MA. In addition, the switch RS is turned on at the same time, and the input node CPI and the output node CPO of the inverter circuit 12 are short-circuited and the input node CPI is automatically reset to an input determination voltage (auto-zero level) of the inverter circuit 12. Although the switch SS is turned on at the same time, switches S3 and TX are in off state.

At a timing t2, when the switch RX is turned off, a reset voltage appears at the node VIN. At a timing t3, when the switch RS is turned off, a reset voltage is sampled in the capacitor CT.

Then, at a timing t4, when the switch TX is turned on, a photoelectric conversion is performed by a photoelectric conversion element (photodiode) PD and accumulated electric charge is transferred to the node FD, so that the node VIN is shifted to a voltage level (photoelectric conversion level) corresponding to the photoelectric-converted electric charge amount. When the voltage level of the node VIN is stabilized at a timing t5 and the switch TX is turned off and the switch S3 is turned on, a voltage difference between the voltage level (photoelectric conversion level) of the node VIN at that time and an initial voltage of the ramp voltage $V_{RAMP}$ is held in the capacitor CR.

Then, at a timing t6, when the switch SS is turned off, a differential value $V_{SIG}$ between the reset voltage (timing t3) and the photoelectric conversion level (timing 6) of the node VIN is held in the input node CPI as an analog voltage to be converted.

At a timing t7, when a voltage value of the ramp voltage $V_{RAMP}$ starts to increase gradually, the voltage of the input node CPI is also increased so as to be proportional to the voltage increase of the ramp voltage $V_{RAMP}$. In addition, at the timing t7, the counter 15 starts to count at the same time.

At a timing t8, when the voltage level of the input node CPI exceeds the input determination voltage of the inverter circuit 12, the inverter circuit 12 inverts the output level of the output node CPO. The latch circuit 13 holds the value of the counter output in response to the output change of the output node CPO.

Here, the differential value $V_{SIG}$ corresponds to an incident light amount to the photoelectric conversion element PD, and the value of the latched counter output is equal to an A/D conversion value (digital value) of the differential value $V_{SIG}$. Thus, when the A/D conversion value held by the latch circuit 13 is outputted, the column-type A/D converter 51 completes the A/D conversion operation of the analog voltage to be converted $V_{SIG}$.

In addition, a view showing a schematic constitution of the ramp voltage generation circuit 50 is shown in Japanese Unexamined Patent Publication No. 2006-018663.

FIG. 13 is a circuit block diagram showing a schematic constitution of the conventional ramp voltage generation circuit described in the above Japanese Unexamined Patent Publication No. 2006-018663. The conventional ramp voltage generation circuit 50 comprises a stabilization voltage source Vref generating a constant voltage, an operation amplifier AMP1, a MOS transistor MNSF, a resistance Rref to generate a constant current based on an input voltage of the operation amplifier AMP1, MOS transistors MP1 and MP2 and MN1 and MN2 constituting current mirrors, a switch SW_ramp to control a generation timing of a ramp wave, an operation amplifier AMPint, a capacitive load Cint, a stabilization voltage source Vc, and a switch SW_reset to reset a charging amount of the capacitive load Cint.

In addition, in order to avoid complication due to increase of references, the sign allotted to each capacitor (capacitive load) shows the capacitance value of the capacitor as it is, and similarly, the sign allotted to each resistive load shows the resistance value of the resistive load as it is. That is, the same sign of the capacitor is used for the capacitance value and the same sign of the resistance is used for the resistance value of the resistance in the following description.

An output voltage $V_{REF}$ is inputted from the stabilization voltage source to a non-inversion input terminal of the operation amplifier AMP1. Since the non-inversion input terminal and an inversion input terminal of the operation amplifier AMP1 are virtually short-circuited, a voltage $V_{REF\_COPY}$ (voltage of node VREF_COPY) inputted to the inversion input terminal is the same as the voltage $V_{REF}$ of the node VREF. Therefore, a current Iref flowing in the resistance Rref is expressed by the following formula 1.

$$Iref = \frac{V_{REF}}{Rref}. \tag{1}$$

Thus, the same current as the current Iref calculated in the formula 1 is led to the transistor MP2 by a current mirror comprising the transistors MP1 and MP2, and the same current Iint as the current Iref is led to the transistor MN2 by a current mirror comprising the transistors MN1 and MN2. That is, the current Iint is calculated by the following formula 2.

$$I\text{int} = Iref = \frac{V_{REF}}{Rref} \tag{2}$$

The current Iint has a value depending on charging and discharging speed of the charge stored in the capacitive load Cint. When it is assumed that the voltage applied to both ends of the capacitive load Cint is determined by a voltage difference between the inversion input terminal and the output terminal of the operation amplifier AMPint, and the inversion input terminal and the non-inversion input terminal of the operation amplifier is at the same potential due to the virtual short circuit state referring to FIG. 13, the following formula 3 is established.

$$\frac{d(V_{RAMP} - Vc)}{dt} = \frac{I\text{int}}{C\text{int}} \tag{3}$$

Here, in the ramp voltage generation circuit 50, when the switch SW_reset is turned on, both ends of the capacitive load Cint becomes the same potential and reset state is provided. In addition, when the switch SW_ramp is turned on, the timing of the current Iint is controlled. That is, the generation timing and the waveform of the ramp voltage are determined by on/off control of both switches.

FIG. 14 shows a waveform example of the ramp voltage generated by the ramp voltage generation circuit 50 and its timing chart. The switch SW_reset is turned on and the capacitor Cint is reset by timing t7. When the reset operation is performed, the voltage $V_{RAMP}$ of the output terminal (output node) of the ramp voltage generation circuit 50 shows the same voltage (Vc) as that of the non-inversion input terminal. Then, when the switch SW_reset is turned off and the switch SW_ramp is turned on at the timing t7, electric charge is drawn from the capacitive load Cint by the constant current Iint, whereby the voltage $V_{RAMP}$ shows a ramp voltage waveform having an inclined angle of θ. This ramp voltage rises from the timing t7 until the switch SW_ramp is turned off after a lapse of time Tint. An increased value (wave crest value) of the ramp voltage $V_{RAMP}$ when the switch SW_ramp is turned off is defined as a full scale voltage $V_{FS}$.

At this time, the value of the ramp voltage $V_{RAMP}$ at a time "t" from the timing 7 until the lapse of Tint is calculated by the following formula 4 referring to FIG. 14.

$$V_{RAMP} = Vc + \frac{V_{REF}}{Rref \cdot C\text{int}} \cdot (t - t7) \tag{4}$$

That is, the inclined angle θ of the change of the ramp voltage $V_{RAMP}$ shown in FIG. 14 is expressed by the following formula 5. In addition, the dimension of the inclined angle θ shown in the drawing is (voltage/time) that shows a voltage change per unit time.

$$\theta = \frac{V_{REF}}{Rref \cdot C\text{int}} \tag{5}$$

In addition, the full scale voltage $V_{FS}$ shown in FIG. 14 is expressed by the following formula 6 with reference to the above formula 5.

$$V_{FS} = \frac{V_{REF}}{Rref \cdot C\text{int}} \cdot T\text{int} \tag{6}$$

Meanwhile, according to Razavi, "Design of Analog CMOS Integrated Circuits" McGrawHill 2001, p. 647, p. 650, it is reported that a resistance value of a resistance element or a capacitance value of a capacitive load formed on an integrated circuit is varied by about ±20% among wafers and lots. This fact means that the values of the resistance Rref and the capacitive load Cint have variations of about ±20% in the ramp voltage generation circuit 50. Therefore, when it is assumed that an average value of the resistance Rref and an average value of the capacitive load Cint are Rrefb and Cintb, respectively, the inclined angle θ of the ramp voltage $V_{RAMP}$ takes a range expressed by the following formula 7 based on the formula 5.

$$\frac{V_{REF}}{(1.2 \cdot Rrefb)(1.2 \cdot C\text{int} b)} \leq \theta \leq \frac{V_{REF}}{(0.8 \cdot Rrefb)(0.8 \cdot C\text{int} b)} \tag{7}$$

In addition, since the formula 7 shows a range of the value of the inclined angle θ when the resistance Rref and the capacitive load Cint are most extremely varied, it is known that the variation up to ±30% is generated actually. Thus, the variation of the inclined angle θ causes the variation of about ±30% in full scale voltage.

FIG. 15 is a graph showing the influence of the variation of the inclined angle θ on the A/D conversion result in a case where the A/D converter 51 performs the A/D conversion using the ramp voltage from the ramp voltage generation circuit 50 having a variation in the inclined angle θ. For example, when the inclined angle θ is varied like θ1, θ2 or θ3 in FIG. 15, a time required to reach the auto-zero level differs. According to the example shown in FIG. 15, in the case of the largest inclined angle of θ3, a time required to reach the auto-zero level is the fastest and in the case of the smallest inclined angle of θ1, a time required to reach the auto-zero level is the latest. When the voltage of the node CPI reaches the auto-zero level, the node CPO is inverted and the value of the counter output latched by the latch circuit 13 at that timing is a converted digital value. That is, when the timing of the voltage that reaches the auto-zero level fluctuates, it means that the A/D converted value fluctuates. Therefore, when a digital image is created based on the output value (digital value) from such an A/D converter, the problem is that an image different from a target image (variation in luminance of the image with respect to each chip) is created.

SUMMARY OF THE INVENTION

The present invention was made in view of the above problem and it is an object of the present invention to provide an A/D converter preventing a variation in digital value obtained by an A/D conversion operation. In addition, it is another object of the present invention to provide a ramp voltage generation circuit suitable for the above A/D converter and a constant current source suitable for the ramp voltage generation circuit.

A constant current source according to the present invention to attain the above object comprises a constant voltage source, and a resistive load converting a voltage generated from the constant voltage source to a constant current contributing to charge and discharge of a capacitive load, and it is characterized in that the resistive load comprises a switched capacitor, as first characteristics.

According to the first characteristics of the constant current source according to the present invention, since the resistive load comprises the switched capacitor, it is not necessary to provide a resistive load itself. When the resistive load and the capacitive load are mounted on a chip, since both are mounted in different manufacturing processes, characteristics caused by the element variation at the time of manufacturing are separately varied. Meanwhile, in the case of this constitution in which the resistive load itself is not provided but a resistive component is equivalently provided with the switched capacitor, when it is mounted on the chip with another capacitive load, since the capacitor constituting the switched capacitor and another capacitive load are mounted in the same manufacturing process, the variation degree are about the same between them even when the characteristics are varied due to the element variation at the time of the manufacturing. Thus, since the voltage generated at both ends of the capacitive load changing when the capacitive load is charged or discharged is a value determined based on a ratio of both capacitive components, it is not affected by the element variation of each of the switched capacitor and the capacitive load. Therefore, when the capacitive load is charged or discharged using the constant current source of the present invention, a voltage prevented from being affected by the element variation at the time of the manufacturing can be generated at both ends of the capacitive load.

In addition to the first characteristics, the constant current source according to the present invention comprises a capacitive component connected to the switched capacitor in parallel to stabilize a current conversion operation by the switched capacitor, as second characteristics.

According to the second characteristics of the constant current source (sampling clock signal) in the present invention, even when a frequency of a clock signal to operate the switched capacitor becomes high, since charges stored in the capacitive component (referred to as "stabilization capacitor" hereinafter) provided for stabilization is applied to a capacitor (sample and hold capacitor) in the switched capacitor, a voltage of the capacitor can reach a target reference voltage before the voltage is applied to both ends of the capacitor. Therefore, even when the frequency of the sampling clock signal becomes high, a stable constant current can be generated. In addition, this stabilization capacitor has capacitance sufficiently higher (10 times, for example) than the sample and hold capacitor provided in a switched capacitor circuit.

In addition, a ramp voltage generation circuit according to the present invention comprises a capacitive load to be charged and discharged based on the constant current generated from the constant current source comprising the above first or second characteristics, and it is characterized in that a ramp voltage is generated based on an output at one end of the capacitive load, as first characteristics.

According to the first characteristics of the ramp voltage generation circuit in the present invention, since the capacitive load is charged and discharged based on the constant current generated from the constant current source comprising the switched capacitor, the voltage at both ends of the capacitive load changing by the charging and discharging is not largely affected by the element variation of the switched capacitor and the capacitive load. Thus, a stable ramp voltage prevented from being affected by the element variation at the time of manufacturing can be generated.

In addition to the first characteristics, the ramp voltage generation circuit according to the present invention is characterized in that an inclination of the generated ramp voltage can be controlled by changing any one of a voltage value generated from the constant voltage source, an equivalent resistance value of the switched capacitor and a capacitance value of the capacitive load, as second characteristics.

According to the second characteristics of the ramp voltage generation circuit in the present invention, the inclination of the change (inclined angle) of the generated ramp voltage can be controlled according to a purpose. Therefore, a time required for the ramp voltage generated from the ramp voltage generation circuit to change to a predetermined voltage value can be changed and controlled for any purpose.

In addition, an A/D converter according to the present invention comprises the ramp voltage generation circuit comprising the first or second characteristics, a voltage comparison circuit sampling and holding one or more analog voltages to be converted, and comparing the sampled and held one or more analog voltages to be converted with a reference voltage given by a voltage change value of the ramp voltage generated from the ramp voltage generation circuit or a voltage value proportional to the voltage change value by an arithmetic unit, and changing its output when the reference voltage equals the analog voltage to be converted, a counter counting a digital value according to the reference voltage and outputting the digital value, and a latch circuit latching the digital value outputted from the counter and outputting the latched digital value when the output of the voltage comparison circuit is changed, as first characteristics.

According to the first characteristics of the A/D converter in the present invention, since the A/D conversion operation is performed with the ramp voltage prevented from being affected by the element variation, the analog voltage value to be converted can be converted to stable digital data having a small variation.

In addition to the first characteristics, the A/D converter according to the present invention is characterized in that the arithmetic unit comprises an inverter circuit, and a voltage synthesis circuit to generate a composite voltage provided by adding a differential voltage between the analog voltage to be converted and the reference voltage, to an input determination voltage of the inverter circuit, as an input voltage of the inverter circuit, as second characteristics.

In addition to the first characteristics, the A/D converter according to the present invention is characterized in that the arithmetic unit comprises a differential input type of operation amplifier receiving the analog voltage to be converted and the ramp voltage as input voltages, as third characteristics.

According to the second or third characteristics of the A/D converter in the present invention, the A/D converter providing digital data prevented from being affected by the element variation can be implemented with a simple circuit constitution.

In addition to any one of the first to third characteristics, the A/D converter according to the present invention is characterized in that a ratio between a frequency of the sampling clock signal used in the switched capacitor in the ramp voltage generation circuit and a frequency of a counter clock signal used in the counter is kept constant, as fourth characteristics.

According to the fourth characteristics of the A/D converter in the present invention, a full scale voltage does not depend on the clock frequency of the counter clock signal. Thus, when the A/D converter according to the present invention is used in an imaging device, since the full scale voltage is not changed in response to a frame rate of the imaging device, the same digital value can be outputted from the same analog conversion value regardless of the frame rate. That is, the A/D converter can flexibly respond to any frame rate.

In addition to any one of first to fourth characteristics, the A/D converter according to the present invention is characterized in that a gain can be set for the digital value converted from the analog voltage to be converted by controlling an inclination of the ramp voltage generated from the ramp voltage generation circuit, as fifth characteristics.

According to the fourth characteristics of the A/D converter in the present invention, when it is used in the imaging device, since the gain can be set in accordance with the frame rate, a preferable digital image can be generated corresponding to the brightness of an object.

DETAILED DESCRIPTION OF THE INVENTION

Embodiments of a ramp voltage generation circuit according to the present invention (referred to as "circuit of the present invention" occasionally hereinafter) and an A/D converter (referred to as "device of the present invention" occasionally hereinafter) will be described with reference to the drawings hereinafter.

First Embodiment

A first embodiment (referred to as "this embodiment" occasionally hereinafter) of the circuit of the present invention and the device of the present invention will be described with reference to FIGS. 1 to 3 hereinafter. In addition, the same references are allotted to the same components and timings as those in FIGS. 11 to 15 described in the section of the related art and the problem to be solved by the invention, in each drawing and their description will be omitted in the following description.

Figure 1:
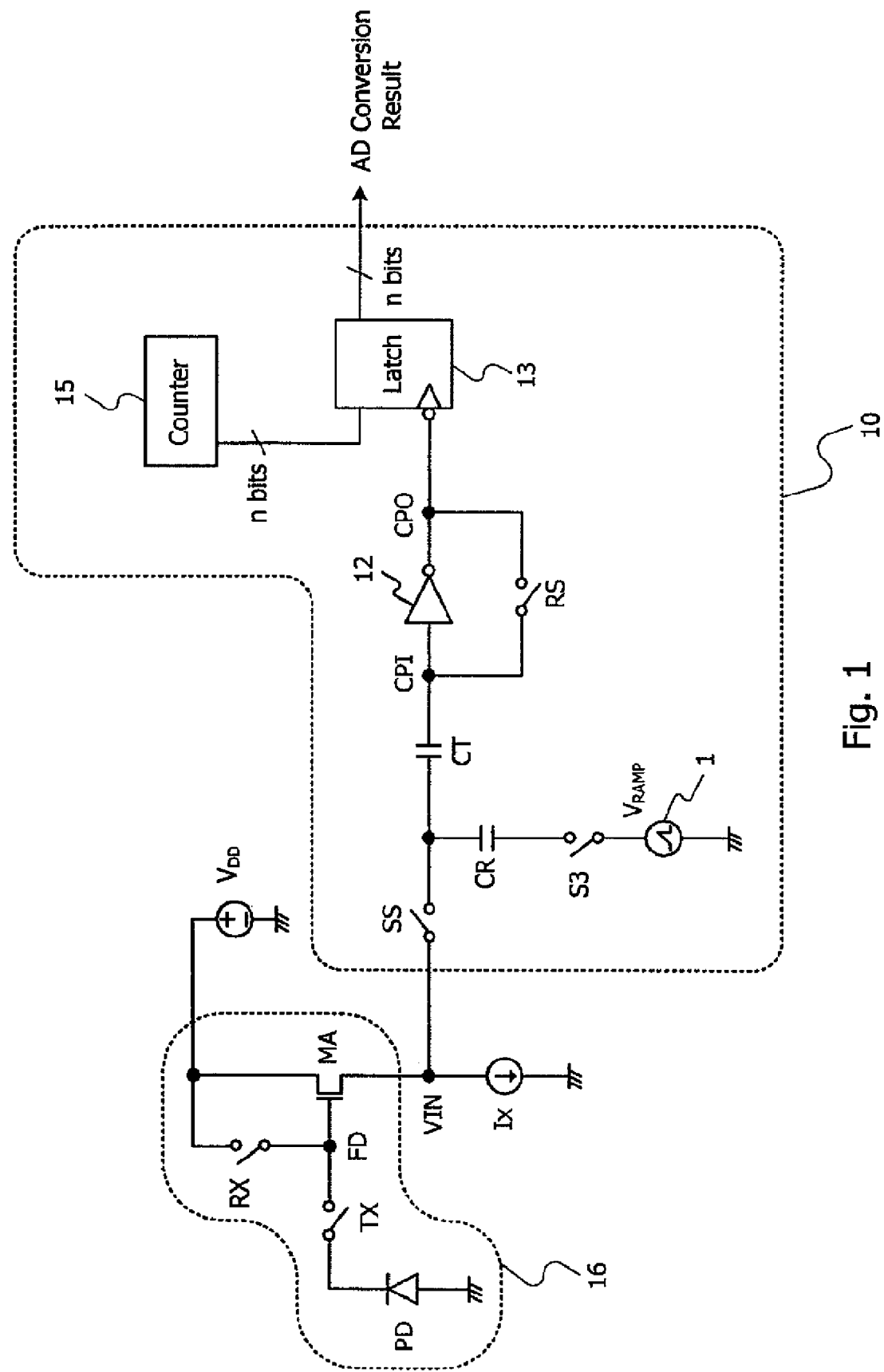
FIG. 1 is a circuit block diagram showing a schematic constitution of a first embodiment of an A/D converter according to the present invention.

FIG. 1 is a circuit block diagram showing a schematic constitution of a circuit of the present invention and a device of the present invention. Although a device 10 of the present invention shown in FIG. 1 comprises a circuit 1 of the present invention instead of the ramp voltage generation circuit 50 provided in the A/D converter 51 shown in FIG. 11, the rest constitution is the same as that shown in FIG. 11. That is, except that a ramp voltage used when the device 10 performs an A/D conversion process is a ramp voltage generated from the circuit 1 of the present invention, its operation contents are the same as those of the A/D converter 51.

Figure 2:
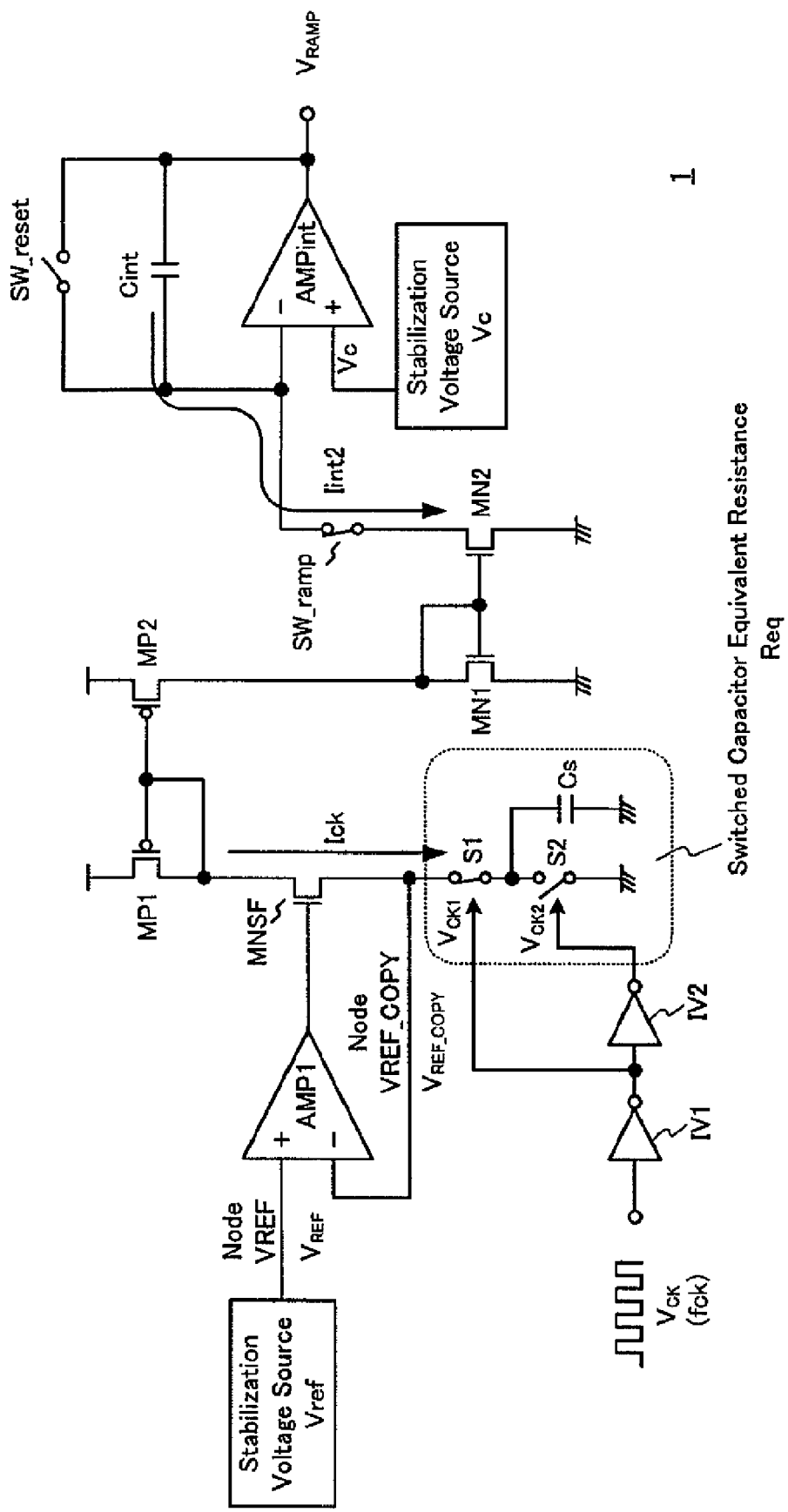
FIG. 2 is a circuit block diagram showing a schematic constitution of the first embodiment of a ramp voltage generation circuit according to the present invention.

FIG. 2 is a circuit block diagram showing a schematic constitution of the circuit 1 of the present invention. According to the circuit 1 of the present invention shown in FIG. 2, an equivalent resistance Req comprising a switched capacitor is provided instead of the resistance Rref to generate the constant current Iref in the conventional ramp voltage generation circuit 50 shown in FIG. 13, and the rest constitution is the same as that of the ramp voltage generation circuit 50. The equivalent resistance Req comprising the switched capacitor is referred to as "equivalent resistance Req" simply hereinafter.

The equivalent resistance Req shown in FIG. 2 comprises two switches S1 and S2 and a capacitor Cs connected to the switch S2 in parallel. Each of the switches S1 and S2 is turned on or off based on a clock signal $V_{CK}$ (referred to as "sampling clock signal $V_{ck}$" hereinafter), and the on/off states are different between the switches S1 and S2. In addition, a clock frequency of the sampling clock signal $V_{ck}$ is referred to as "fck" (referred to as "sampling clock frequency fck" occasionally hereinafter).

Figure 3A:
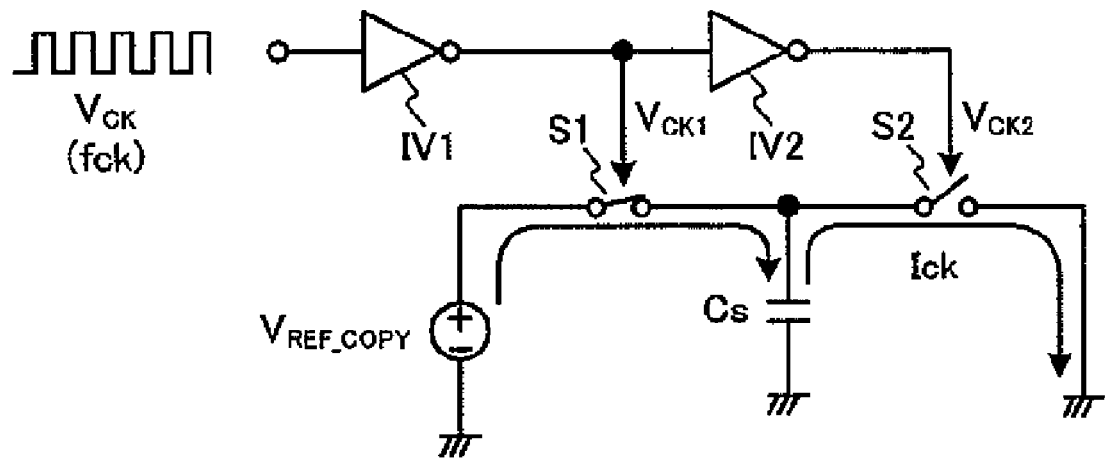
FIG. 3 is a circuit block diagram to explain an operation of a switched capacitor (equivalent resistance)
Figure 3B:
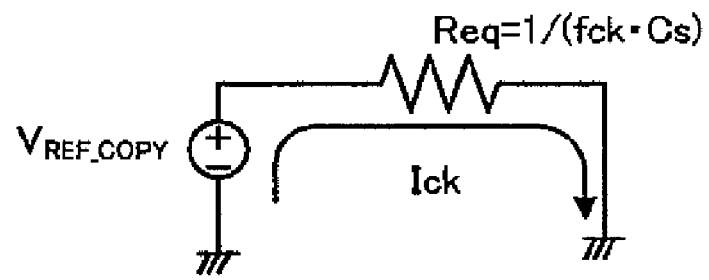

FIG. 3 is a circuit block diagram to explain an operation of the equivalent resistance Req, in which FIG. 3A is a circuit block diagram showing a switched capacitor circuit comprising the equivalent resistance Req and FIG. 3B is its equivalent circuit.

As shown in FIG. 3A, the sampling clock signal $V_{CK}$ (frequency fck) is inputted to an inverter circuit IV1 and its output is inputted to an inverter circuit IV2 In addition, the switches S1 and S2 are turned on or off depending on active states of the output signals of the inverter circuits. For example, when the sampling clock switch $V_{CK}$ becomes low state, the clock signal is inverted by the inverter circuit IV1, and as a result, a signal $V_{CK1}$ showing high state is applied to the switch S1 and the switch S1 is turned on. Meanwhile, when the signal $V_{CK1}$ in high state is inputted to the inverter IV2, the signal is inverted by the inverter circuit IV2, and as a result, a signal $V_{CK2}$ showing low state is applied to the switch S2 and the switch S2 is turned off. As a result, a node VREF_COPY connected to one terminal of the switch S1 is charged (sampled) in the capacitor Cs and shows a voltage $V_{REF\_COPY}$.

Thus, when the sampling clock signal $V_{CK}$ becomes high state, since the signal $V_{CK1}$ is shifted to low state and the signal $V_{CK2}$ is shifted to high state, the switch S1 is turned off and the switch S2 is turned on. Thus, discharging is performed through the switch S2 based on the voltage $V_{REF\_COPY}$ charged in the capacitor Cs (current Ick).

Here, the current Ick flowing through the switch S2 when the switch S2 is turned on is expressed by the following formula 8 based on law of conservation of charge.

$$Ick = fck \cdot Cs \cdot V_{REF\_COPY} \quad (8)$$

Therefore, the equivalent resistance Req shown by the switched capacitor is expressed by the following formula 9.

$$Req = \frac{1}{fck \cdot Cs} \quad (9)$$

That is, it can be understood that the circuit 1 of the present invention comprising the switched capacitor is equivalent to a case where the equivalent resistance Req shown by the formula 9 is inserted between an operation amplifier AMP1 and a ground line. In other words, the current Ick flowing through the switched capacitor in the circuit 1 of the present invention shown in FIG. 1 is expressed by the formula 8 using the sample and hold capacitor Cs and the sampling clock frequency fck.

Thus, the current Ick leads a current having the same current amount to a transistor MP2 by a current mirror constituted by the transistors MP1 and MP2, and leads a current Iint2 having the same current amount to a transistor MN2 by another current mirror constituted by the transistors MN1 and MN2. At this time, as described above, when a switch SW_ramp is in on state, since charge is drawn by the current Iint2 from a capacitive load Cint, a ramp voltage $V_{RAMP}$ is generated at an output terminal of an operation amplifier AMPint.

Figure 14:
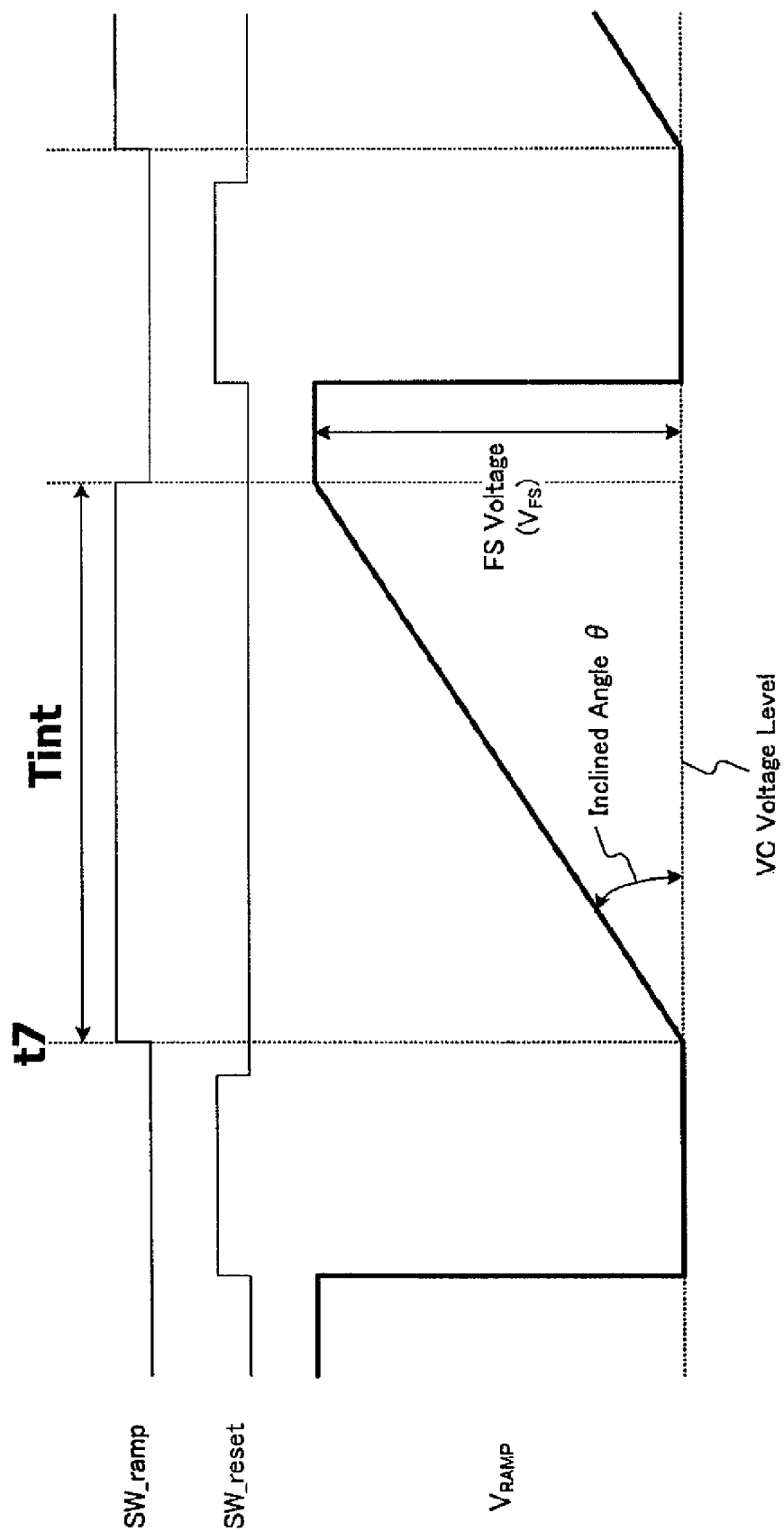
FIG. 14 is a waveform example of a ramp voltage generated from the ramp voltage generation circuit and its timing chart.

Here, when the ramp voltage is generated at the same timing as described in FIG. 14, an incremental value $\Delta V_{RAMP}$ of the ramp voltage $V_{RAMP}$ at t after a lapse of Tint from a timing t7 is expressed by the following formula 10 based on the formula 9 and the formula 4. In addition, in the following formula 10, Tck is a cycle of the sampling clock signal $V_{CK}$ (inverse number of sampling clock frequency fck).

$$\Delta V_{RAMP} = \left(\frac{Cs}{C\mathrm{int}}\right) \cdot V_{REF} \cdot \left(\frac{t-t7}{Tck}\right) \quad (10)$$

Thus, a full scale voltage $V_{FS}$ corresponding to the incremental value $\Delta V_{RAMP}$ of the ramp voltage after the lapse of Tint from the timing t7 is calculated by the following formula 11 by assigning t−t7=Tint to the above formula 10.

$$V_{FS} = \left(\frac{Cs}{C\mathrm{int}}\right) \cdot V_{REF} \cdot \left(\frac{T\mathrm{int}}{Tck}\right) \quad (11)$$

Figure 12:
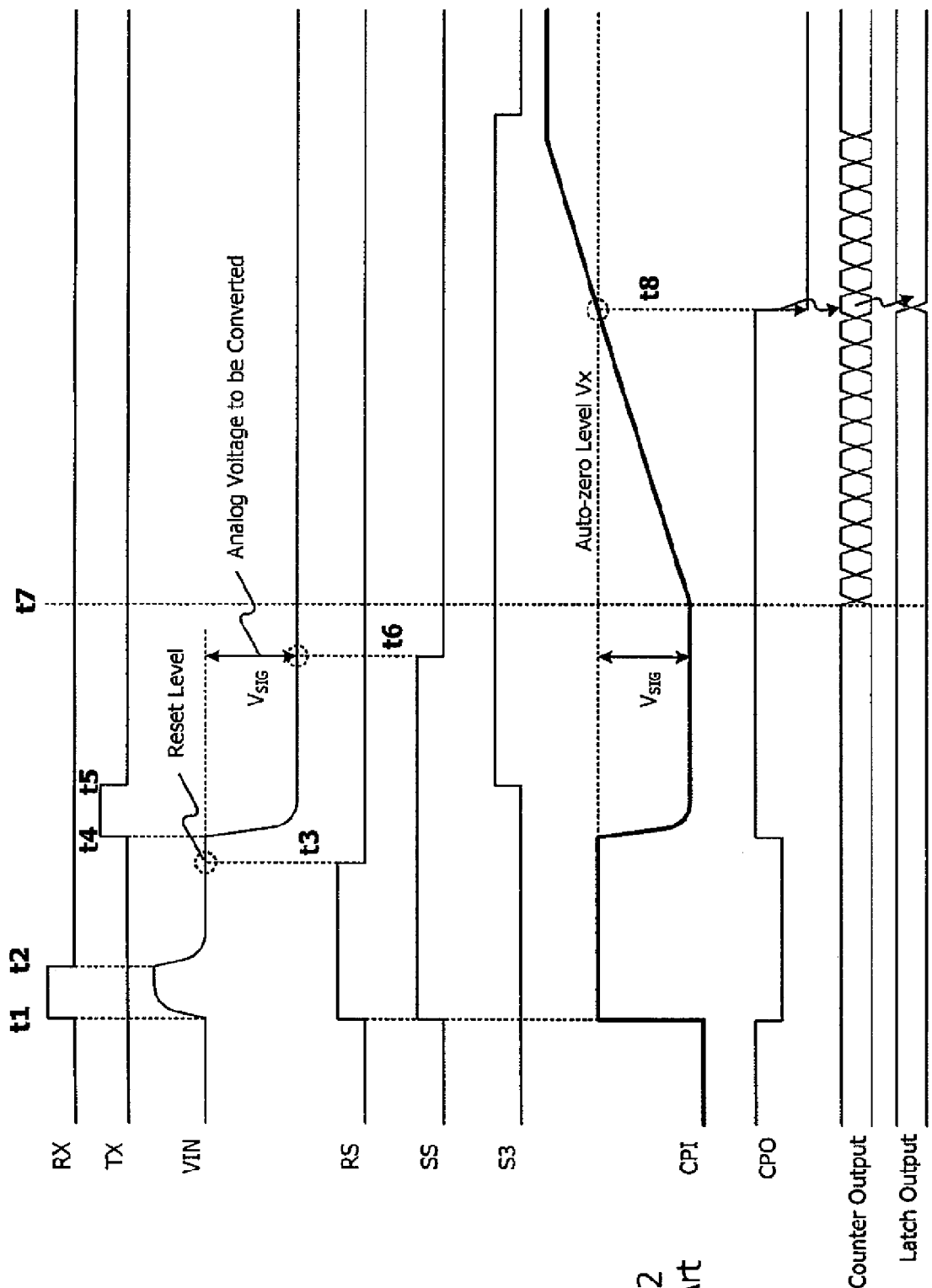
FIG. 12 is a timing chart showing an A/D conversion operation of the conventional column-type A/D converter.
Figure 13:
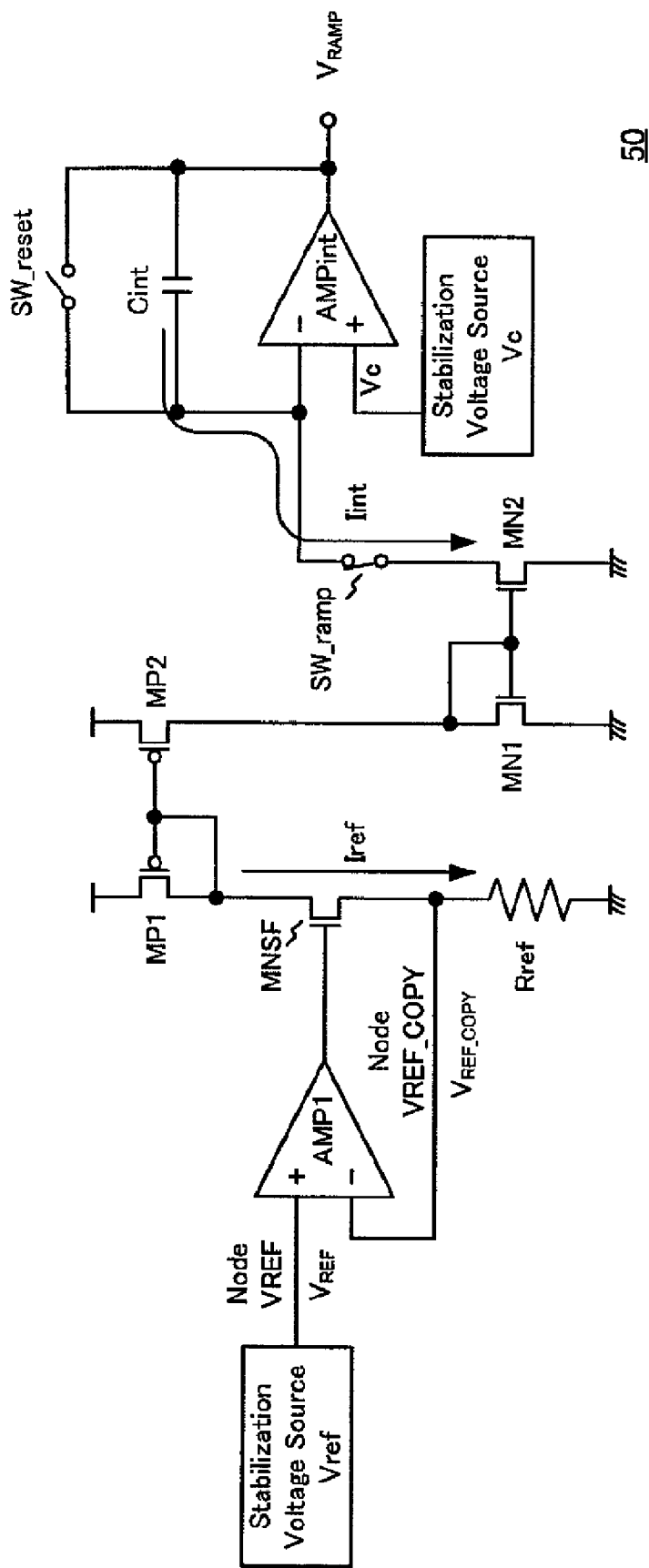
FIG. 13 is a circuit block diagram showing a schematic constitution of a conventional ramp voltage generation circuit.

Here, the clock signal is counted by a counter (referred to as "count clock signal" hereinafter) from the timing t7 until Tint elapses as shown in FIGS. 12 and 14. Therefore, when it is assumed that the switched capacitor circuit performs a switched capacitor operation using the sampling clock signal having the same frequency as that of the counter clock signal inputted to the counter (that is, when the sampling clock frequency fck in FIG. 3 is equal to the frequency of the counter clock signal), since the Tint is multiples of Tck, the term (Tint/Tck) in the formula 11 surely becomes an integer. For example, in a case of an A/D converter having 10-bit precision, since the counter counts from 0 to 1023, the value of the term (Tint/Tck) shows 1024 (=$2^{10}$). That is, when it is assumed that conversion bit precision of the device 10 of the present invention is N, the formula 11 can be replaced with the following formula 12.

$$V_{FS} = \left(\frac{Cs}{C\mathrm{int}}\right) \cdot V_{REF} \cdot 2^N \quad (12)$$

It can be understood from the formula 12 that the full scale voltage $V_{FS}$ depends on a ratio between the sample and hold capacitor Cs of the switched capacitor circuit and the capacity Cint but does not depend on the frequency of the counter clock signal (referred to as "counter clock frequency" occasionally hereinafter).

Meanwhile, it is known that the same kind of element mounted on the same chip has high matching precision in general (refer to the above Razavi, "Design of Analog CMOS Integrated Circuits", McGrawHill 2001, for example). More specifically, according to the circuit 1 of the present invention shown in FIG. 2, even when each of the values of the sample and hold capacitor Cs mounted to implement the switched capacitor circuit, and the capacitor Cint to generate the ramp voltage is varied at the time of mounting, the degree of variations of them are about the same. That is, even when large capacity variation is generated in each capacitor, which does not largely affect the term (Cs/Cint) in the formula 12, so that the term shows a value within almost a constant range.

Therefore, according to the circuit of the present invention, the stable full scale voltage $V_{FS}$ that is not affected by the variation of each element at the time of manufacturing process can be implemented. That is, an inclined angle θ showing a rise rate of the ramp voltage $V_{RAMP}$ in FIG. 14 is prevented from being affected by the element variation at the time of manufacturing process similarly, so that it shows a stable value. Thus, according to the device 10 of the present invention that performs the A/D conversion using the ramp voltage generated from the circuit 1 of the present invention, the variation of the timing when the voltage of a node CPI reaches the auto-zero level is suppressed, so that the stable A/D conversion process prevented from being affected by the element variation can be implemented. Thus, when the device 10 of the present invention is used in a digital camera (solid-state imaging sensor), for example and the device 10 of the present invention performs the A/D conversion process for an analog voltage value corresponding to a received light amount by an light receiving element and generates a digital image based on a generated digital data, a desired image that is prevented from being affected by the element variation can be generated.

More specifically, according to the circuit 1 of the present invention, since the constant current source to generate a constant current required to generate the ramp voltage is not implemented by applying a constant voltage $V_{REF}$ generated from a stabilization voltage source Vref to a load resistance, but implemented by applying that voltage $V_{REF}$ to the switched capacitor, matching precision with the capacitor Cint required to implement the ramp voltage generation circuit is enhanced. Therefore, the constant current source provided in the circuit 1 of the present invention can be used not only in the ramp voltage generation circuit but also in another device comprising a capacitive load having one terminal to which the constant current generated from the constant current source or a current based on the constant current (referred to as "constant current" collectively hereinafter) is applied. Thus, since the constant current is applied to the capacitive load, the element variation at the time of mounting can be prevented from affecting both terminal voltages of the capacitive load.

Second Embodiment

A second embodiment (referred to as "this embodiment" occasionally hereinafter) of a circuit of the present invention and a device of the present invention will be described with reference to FIGS. 4 to 7 hereinafter. In addition, the same references are allotted to the same parts as those in the first embodiment and their description will be omitted.

Figure 4:
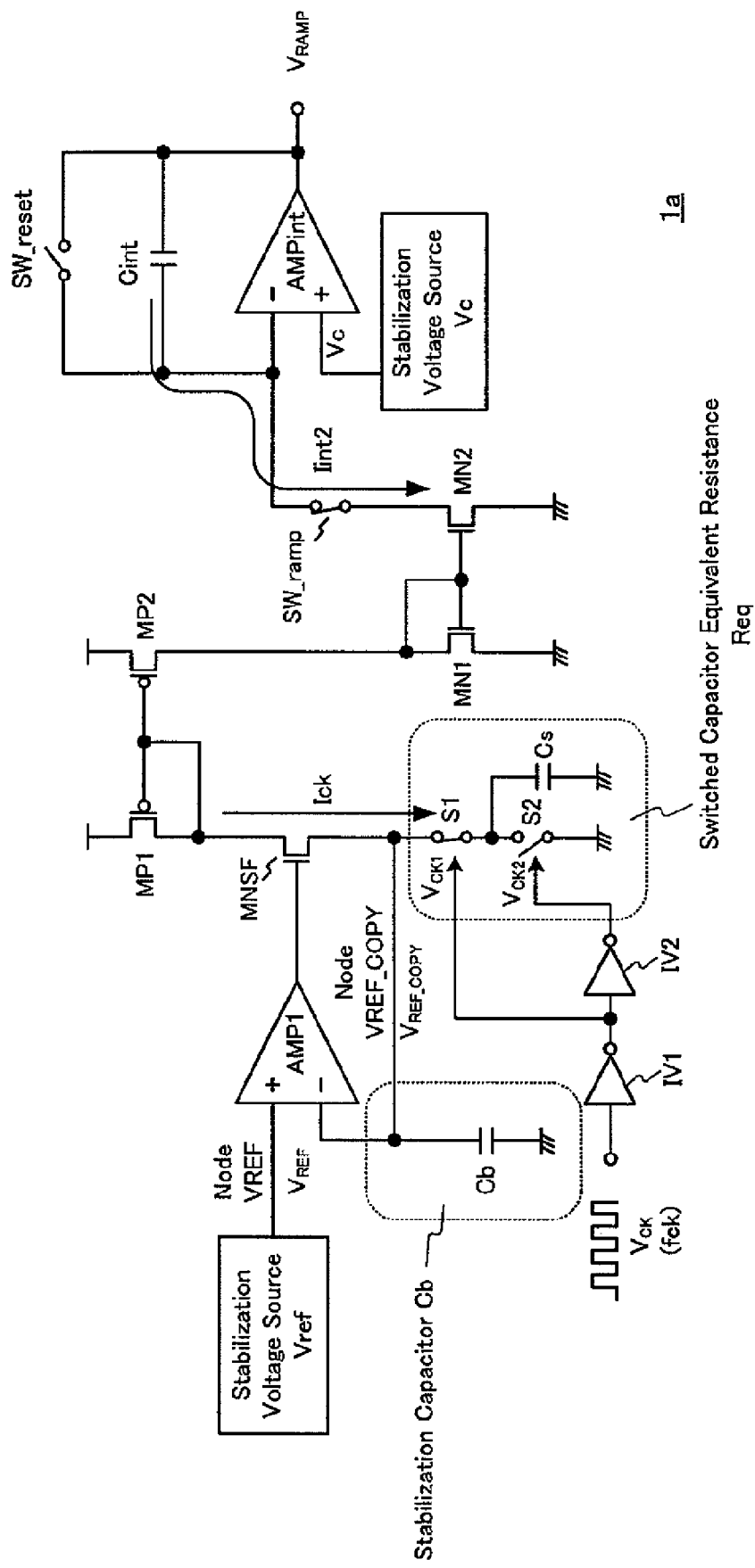
FIG. 4 is a circuit block diagram showing a schematic constitution of a second embodiment of a ramp voltage generation circuit according to the present invention.

FIG. 4 is a circuit block diagram showing a schematic constitution of a circuit of the present invention according to this embodiment. Although the circuit 1a of the present invention shown in FIG. 4 is different from the circuit 1 of the present invention according to the first embodiment in that a stabilization capacitor Cb connected to a switched capacitor equivalent circuit Req in parallel is provided, the rest is the same as those of the circuit 1 of the present invention shown in FIG. 2.

According to a circuit 1a of the present invention, the stabilization capacitor Cb and the sample and hold capacitor Cs are charged with a current Ick applied from a transistor MNSF according to a sampling clock frequency fck. At this time, the capacitors Cb and Cs are charged so that a non-inversion input terminal and an inversion input terminal of an operation amplifier AMP1 become the same voltage. This is implemented by a feedback operation of the operation amplifier AMP1.

Figure 5:
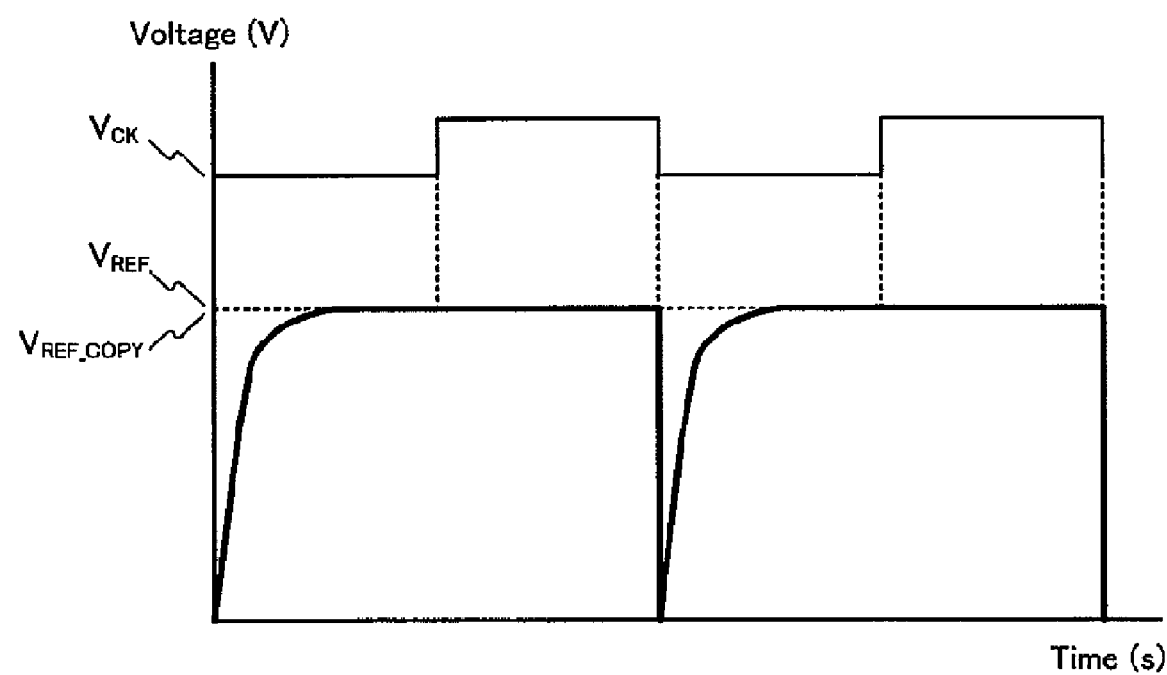
FIG. 5 is a voltage waveform of a node VREF_COPY when a clock frequency of a clock signal is at low speed.
Figure 6:
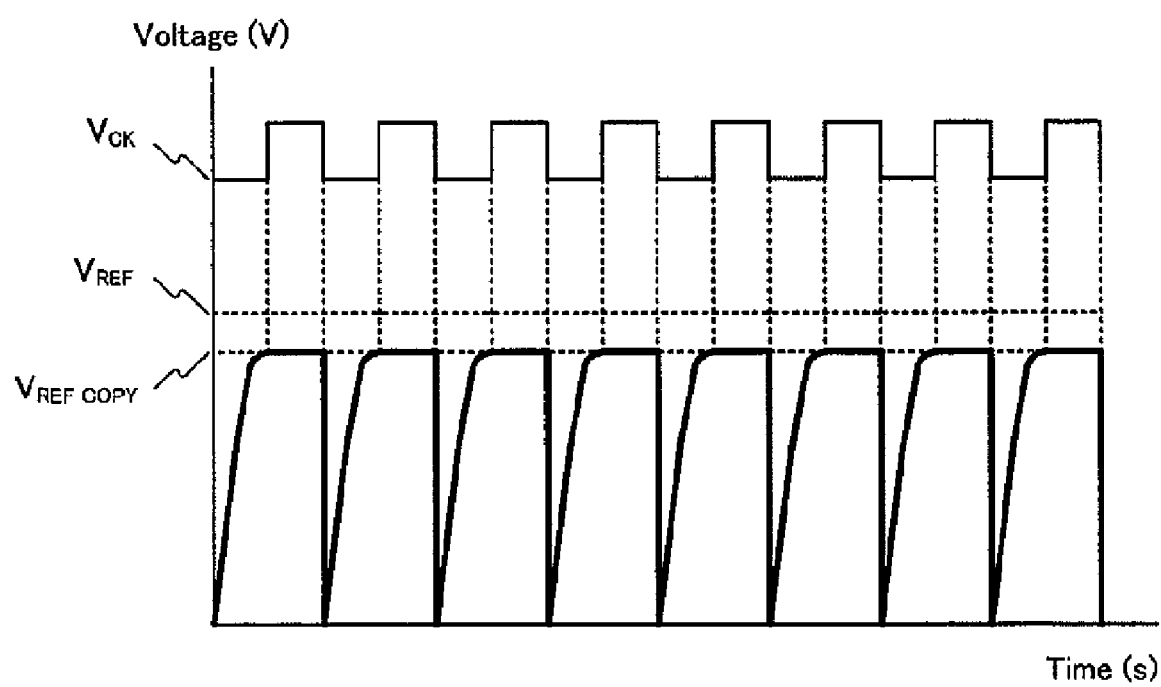
FIG. 6 is a voltage waveform of the node VREF_COPY when the clock frequency of the clock signal is at high speed.
Figure 7:
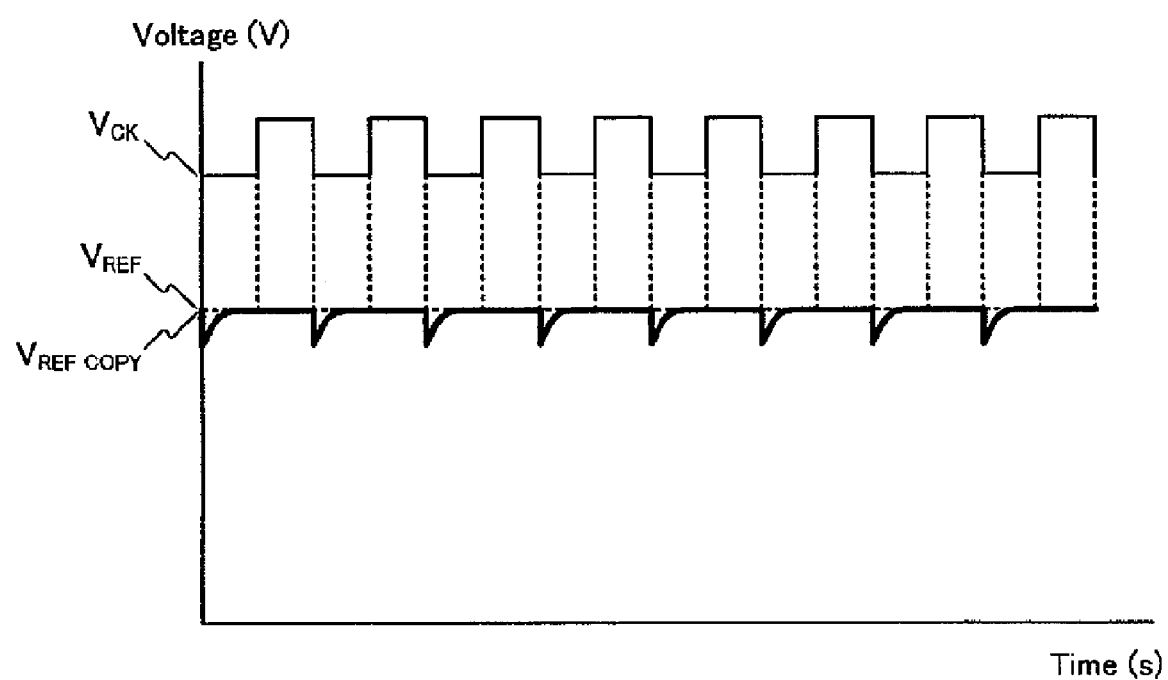
FIG. 7 is a voltage waveform of the node VREF_COPY when the clock frequency of the clock signal is at high speed in a case where a stabilization capacitor is connected to a switched capacitor circuit in parallel.

Here, even when the stabilization capacitor Cb is not provided like in the circuit 1 of the present invention according to the first embodiment, in a case where the sampling clock frequency fck of a sampling clock signal $V_{CK}$ is sufficiently at low speed, a voltage $V_{REF\_COPY}$ of a node VREF_COPY reaches (settles) the level of the voltage $V_{REF}$ at a node VREF connected to the non-inversion input terminal of the operation amplifier AMP1 before the next rise of the clock signal (refer to FIG. 5). However, when the sampling clock frequency fck is at high speed, the next clock signal rises before the voltage $V_{REF\_COPY}$ reaches the level of the voltage $V_{REF}$ in some cases as shown in FIG. 6, which could cause the problem that the voltage $V_{REF\_COPY}$ cannot reach the level of the voltage $V_{REF}$. As described above, since the switched capacitor in the circuit of the present invention is provided to constitute the constant current source that generates the constant current based on the voltage $V_{REF\_COPY}$ of the node VREF_COPY, when the voltage $V_{REF\_COPY}$ repeats the operation without reaching the target voltage $V_{REF}$, a current Ick generated based on this voltage and a current Int2 generated by the current mirror of the current Ick cannot maintain their values, which causes the problem that the stable ramp voltage cannot be generated.

Meanwhile, since the stabilization capacitor Cb connected to the switched capacitor circuit in parallel is provided in this embodiment, the voltage based on the charge stored in the stabilization capacitor Cb is applied to the node VREF_COPY when the sampling clock signal $V_{CK}$ rises and the switch S1 is turned off, so that the lowering of the voltage $V_{REF\_COPY}$ of the node VREF_COPY when the clock signal $V_{CK}$ rises is reduced as compared with the constitution having no stabilization capacitor Cb in the first embodiment. That is, since the voltage amount to be increased so as to become the same level of the voltage $V_{REF}$ again is reduced, even when the sampling clock frequency is at high speed, the voltage of the node VREF_COPY can reach the voltage $V_{REF}$ by the next timing of the rise of the clock signal (refer to FIG. 7).

Thus, as the size of the stabilization capacitor Cb is increased, the reduced amount of the voltage $V_{REF\_COPY}$ of the node VREF_COPY at the timing when the sampling clock signal $V_{CK}$ rises becomes small. As the reduced amount becomes small, a time required for the node VREF_COPY to becomes the same level as the voltage $V_{REF}$ is shortened, so that a time required for the current Ick generated based on the voltage $V_{REF\_COPY}$ of the node VREF_COPY and the current Iint2 generated based on the current Ick to become the stable constant current can be shortened. Since it is preferable that the current Iint2 maintains the constant current without being fluctuated to generate the stable ramp voltage without fluctuating an inclined angle θ of an voltage waveform of the ramp voltage $V_{RAMP}$, it is preferable that the stabilization capacitor Cb has sufficiently high capacitance as compared with the sample and hold capacitor Cs (ten times or more, for example) to generate the stable ramp voltage. When the stabilization capacitor Cb is provided, the stable constant current Ick can be generated regardless of the sampling clock frequency fck of the sampling clock signal $V_{CK}$ and the stable ramp voltage $V_{RAMP}$ can be generated based on this current.

Third Embodiment

A third embodiment (referred to as "this embodiment" occasionally hereinafter) of a circuit of the present invention and a device of the present invention will be described with reference to FIG. 8 hereinafter. In addition, the same references are allotted to the same components as those in the first embodiment or the second embodiment and their description will be omitted. In addition, according to this embodiment, characteristics as will be described below are provided to the sampling clock frequency of the sampling clock signal used in the ramp voltage generation circuit 1 (or 1a), and the rest is the same as those in the above each embodiment.

As described above with reference to FIG. 15, when the inclination (inclined angle) θ of the change of the ramp voltage generated in the ramp voltage generation circuit is varied, the time required to reach the auto-zero level is varied and as a result, the counter output value is changed, which causes digital data after A/D converted to be fluctuated. Therefore, when the inclined angle θ is stabilized, the analog value to be converted can be converted to correct digital data.

However, when it is assumed that the device of the present invention is used in a solid imaging device (refer to FIG. 1), a photoelectric conversion time of a photodiode PD is differentiated according to brightness of an object in general. That is, when the object is bright, since a light amount enough for recognition of imaging information can be inputted to the photodiode PD in a short time, an interval of the timing to apply the voltage after photoelectric conversion, to a node FD (that is, on/off controlling timing of a switch TX) becomes short. Meanwhile, when the object is dark, it is necessary to input the light to the photodiode PD for a time longer than the case where the object is bright, to input a light amount within a range capable of recognizing the image information, to the photodiode PD, and in this case, the interval of the timing to apply the voltage after the photoelectric conversion, to the node FD (that is, the on/off control timing of the switch TX) becomes long.

Thus, the fact that the on/off control timing of the switch TX is different means that a time required for the A/D conversion operation to the voltage after photoelectric conversion is different. That is, after the switch TX has been turned on and the voltage after photoelectric conversion has been applied to a transistor MA and a node VIN has been shifted to a voltage level (photoelectric conversion level) corresponding to a photo-electrically converted electric charge amount, the A/D operation has to be performed by the time a light amount to be inputted at the next timing is determined and the switch TX is turned on. In other words, it is necessary to change the speed of the A/D conversion operation according to the circumstances. The number of images that can be taken in a certain period (frame rate) is determined by the on/off control timing of the switch TX and the A/D conversion process speed.

FIG. 8 shows timing charts to compare a case where the A/D conversion is performed at high speed (frame rate is high) and a case where the A/D conversion is performed at low speed (frame rate is low).

As described above, since a maximum count number N of the counter 15 is determined by the conversion bit precision of the device 10 of the present invention, when the time required for counting the same number is to be changed, it is necessary to change a counter clock frequency of a counter clock signal. Therefore, when the A/D conversion is at low speed as shown in FIG. 8A, it is necessary to reduce the counter clock frequency and when the A/D conversion is at high speed as shown in FIG. 8B, it is necessary to increase the counter clock frequency.

Figure 8A:
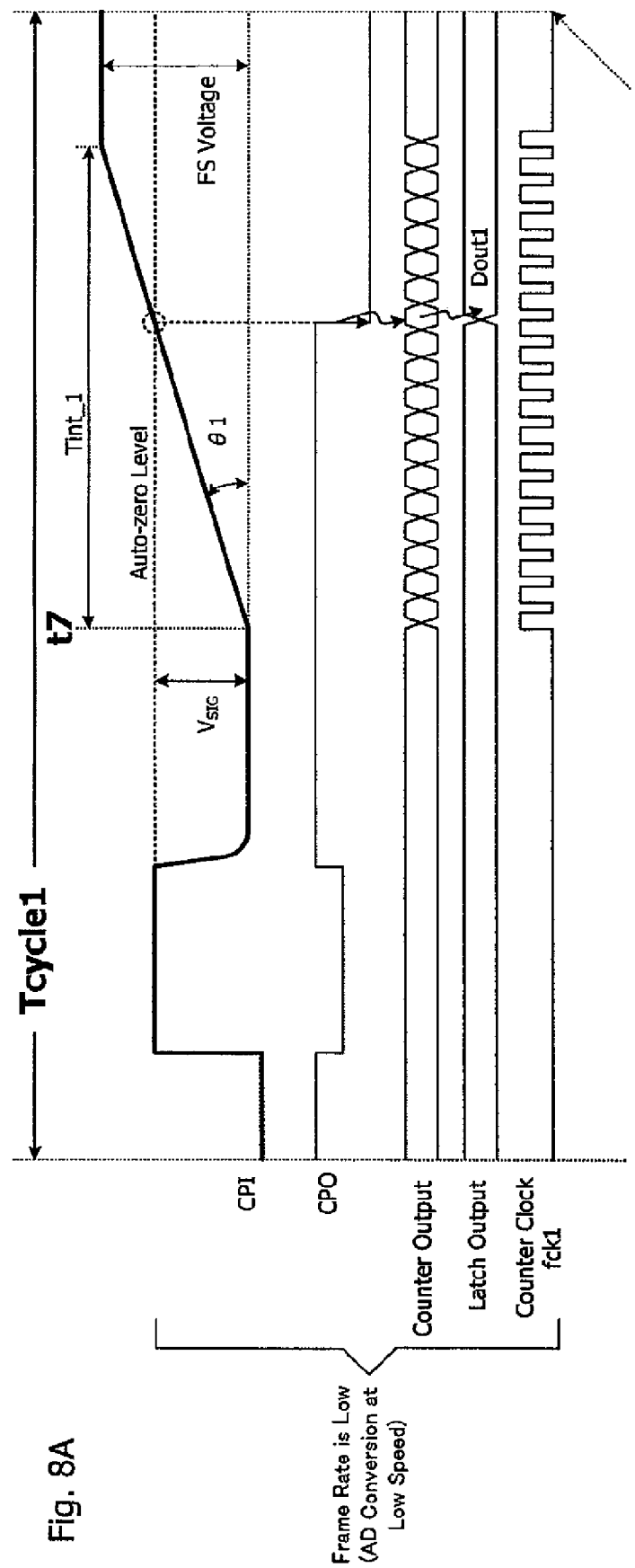
FIG. 8 is a view showing comparison of timing charts when A/D conversion is performed at high speed (frame rate is high) and when the A/D conversion is performed at low speed (frame rate is low)
Figure 8B:
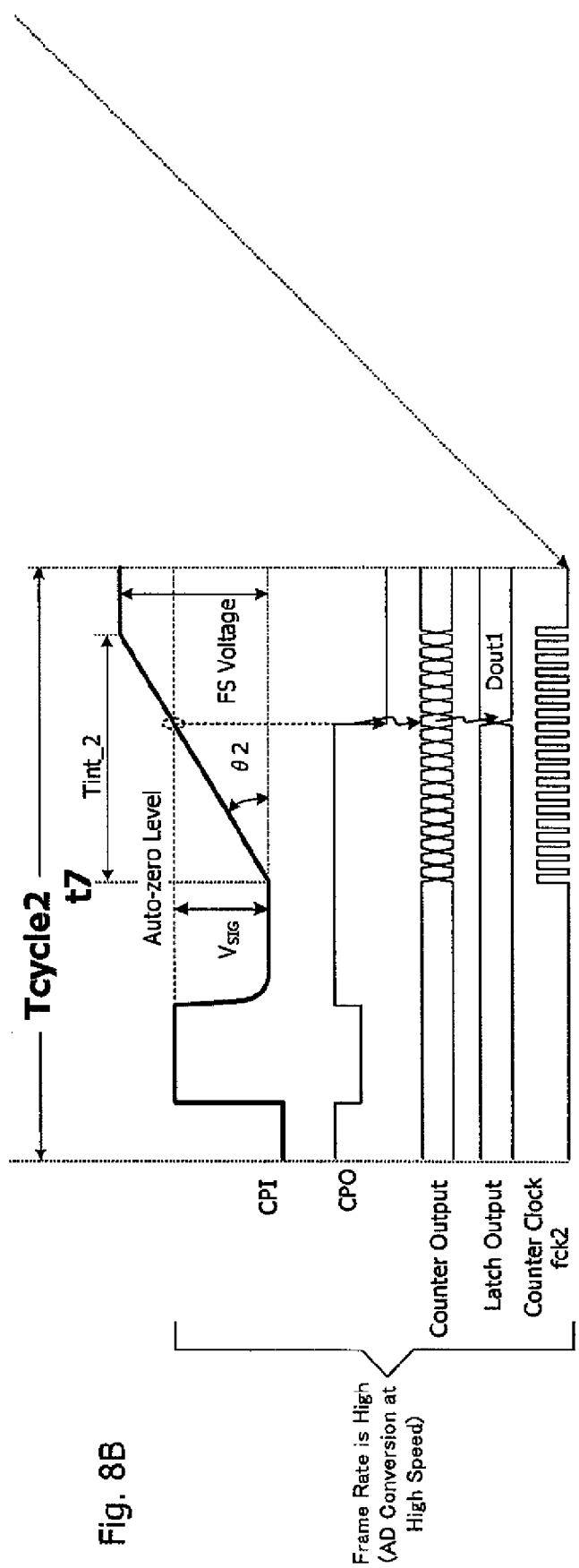

Thus, the same digital conversion value has to be generated for the same voltage $V_{SIG}$ even under the condition that the counter clock frequency is changed according to the above circumstances (data Dout1 in FIG. 8, for example). In other words, it is required that when the voltage $V_{SIG}$ is the same value, the count number counted by the counter 15 until the time the voltage of the node CPI reaches the auto-zero level is not changed regardless of the value of the counter clock frequency. To implement this, it is necessary to change the inclined angle θ according to the counter clock frequency. That is, it is necessary to reduce the inclined angle θ1 when the conversion is at low speed (FIG. 8A) and it is necessary to increase the inclined angle θ2 when the conversion is at high speed (FIG. 8B). This embodiment is characterized in that the full scale voltage $V_{FS}$ shows the constant value by changing the inclined angle θ according to the counter clock frequency.

When the full scale voltage $V_{FS}$ is the constant value, since the count number counted by the counter 15 until the time the voltage of the node CPI reaches the auto-zero level is not changed regardless of the value of the counter clock frequency, the same A/D conversion result Dout1 (FIGS. 8A and 8B) can be provided. Therefore, the A/D converter does not depend on the frame rate.

According to the first embodiment, the description has been made of the fact that when the sampling clock frequency fck is equal to the counter clock frequency, the full scale voltage $V_{FS}$ is expressed by the formula 12. This embodiment is not limited to the case where both clock signals have the same frequency, and when they have the same ratio, the full scale voltage $V_{FS}$ does not depend on the frequency of the clock signal. This will be described hereinafter.

A cycle Tck of the sampling clock signal is an inverse number of the sampling clock frequency fck. Thus, the counter 15 counts the number based on the predetermined counter clock signal, and the time required for completing the counting by the counter 15 is multiples of the cycle of the counter clock signal. The cycle of the counter clock signal is an inverse number of the counter clock frequency. Thus, when the ratio between the counter clock frequency and the sampling clock frequency fck is kept constant, the ratio between the cycle of the counter clock signal and the cycle Tck of the sampling clock signal is kept constant, so that the ratio between the Tint that is the integral multiples of the cycle of the counter clock signal and the cycle Tck of the sampling clock signal can be kept constant.

That is, even when the counter clock frequency is changed, the full scale voltage expressed by a formula 13 shows a constant value without depending on the change of the counter clock frequency by changing the sampling clock frequency fck so as to satisfy that Tint/Tck=A (fixed number).

$$V_{FS} = \left(\frac{Cs}{C\text{int}}\right) \cdot V_{REF} \cdot A \qquad (13)$$

As shown in the formula 13, the full scale voltage $V_{FS}$ is determined only by the ratio between the sampling capacitor Cs and the integral capacitor Cint, a reference voltage $V_{REF}$, and the ratio A between the cycle of the sampling clock signal (that is, corresponding to the sampling time) Tck and the A/D conversion time Tint, and does not depend on the counter clock frequency. In addition, as described above, the formula 12 is the case where the sampling frequency fck is equal to the counter clock frequency of the counter 15, and the ratio A is equal to A/D conversion resolution.

In addition, more specifically, when the sampling clock frequency fck is equal to the counter clock frequency, the same clock signal may be used and when the ratio between the sampling clock frequency fck and the counter clock frequency is kept constant, both clock signals may be generated by appropriately changing a dividing ratio of the same clock signal.

Fourth Embodiment

A fourth embodiment (referred to as "this embodiment" occasionally hereinafter) of a circuit of the present invention and a device of the present invention will be described with reference to FIG. 9 hereinafter. In addition, the same references are allotted to the same components as those in the first, second or third embodiment and their description will be omitted.

Figure 9:
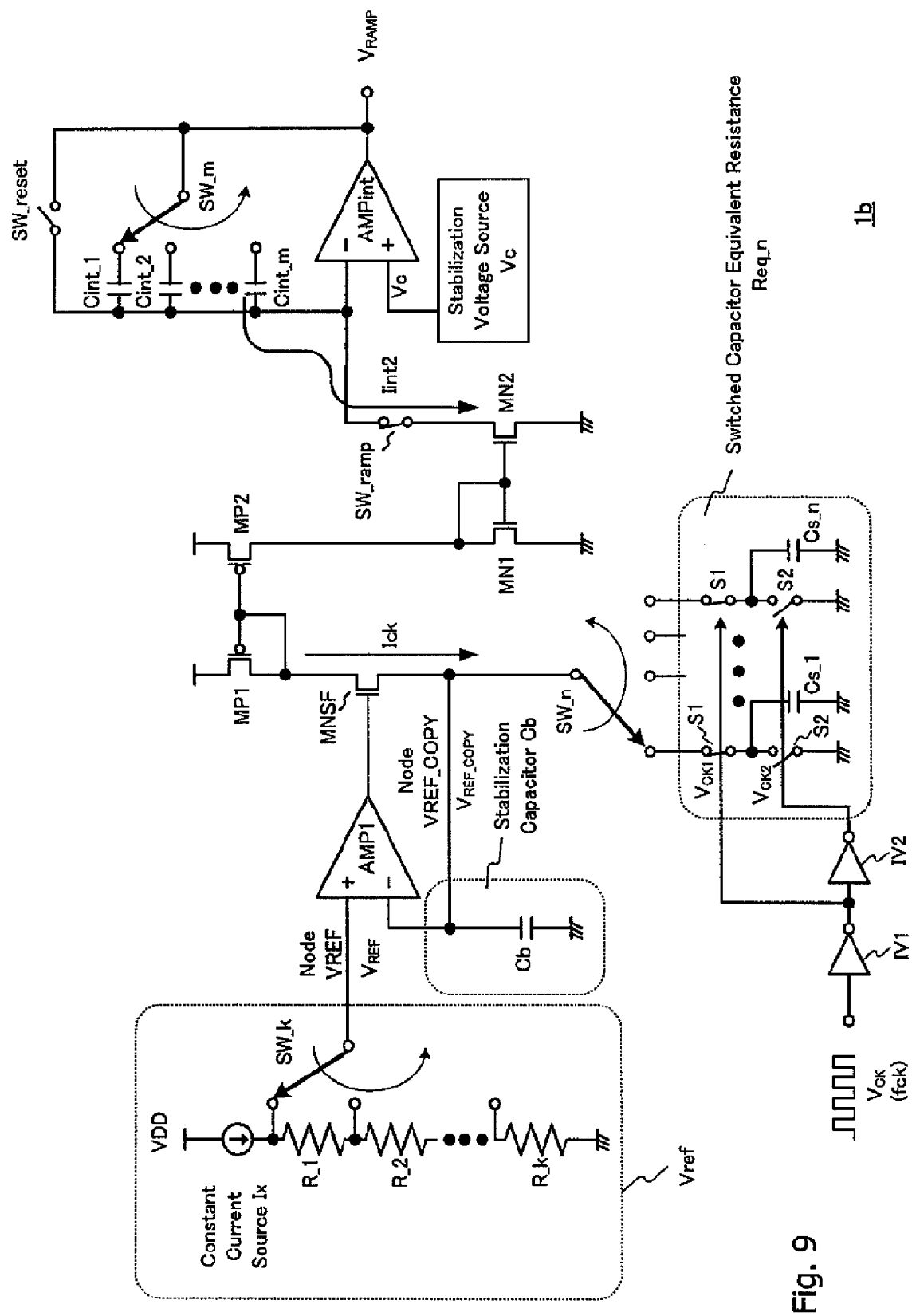
FIG. 9 is a circuit block diagram showing a schematic constitution of a fourth embodiment of a ramp voltage generation circuit according to the present invention.

FIG. 9 is a circuit block diagram showing a schematic constitution of a circuit of the present invention according to this embodiment. A circuit 1b of the present invention shown in FIG. 9 is constituted so as to be able to change each value of a voltage $V_{REF}$ of a stabilization voltage source Vref, an equivalent resistance Req of a switched capacitor circuit, and a capacitive load Cint for a ramp voltage generation, as compared with the circuit 1a of the present invention according to the second embodiment. More specifically, it comprises switches SW_k, SW_n and SW_m and when the connecting point is changed by these switches, the voltage $V_{REF}$, the equivalent resistance Req or the capacitive load Cint can be changed.

That is, as shown in FIG. 9, a stabilization voltage source Vref in a circuit 1b of the present invention according to this embodiment comprises a constant current source Ix and a resistance connected thereto, and the connecting point of the switch SW_k can be switched. When a resistance value to obtain the voltage $V_{REF}$ is changed, the voltage $V_{REF}$ is changed. In addition, a switched capacitor circuit Req comprises a plurality of switched capacitor circuits having different equivalent resistances and when the switched capacitor circuit connected to a node VREF_COPY is changed, the equivalent resistance Req of the switched capacitor circuit can be changed. In addition, a plurality of capacitive loads having different capacitances are provided, and when the capacitive load having one terminal connected to an amplification output terminal of an operation amplifier AMPint and the other end connected to an inversion input terminal of the operation amplifier AMPint is changed, the capacitive load to be charged and discharged based on a current Iint2 is changed, whereby an inclined angle θ of the voltage $V_{RAMP}$ is changed.

Figure 15:
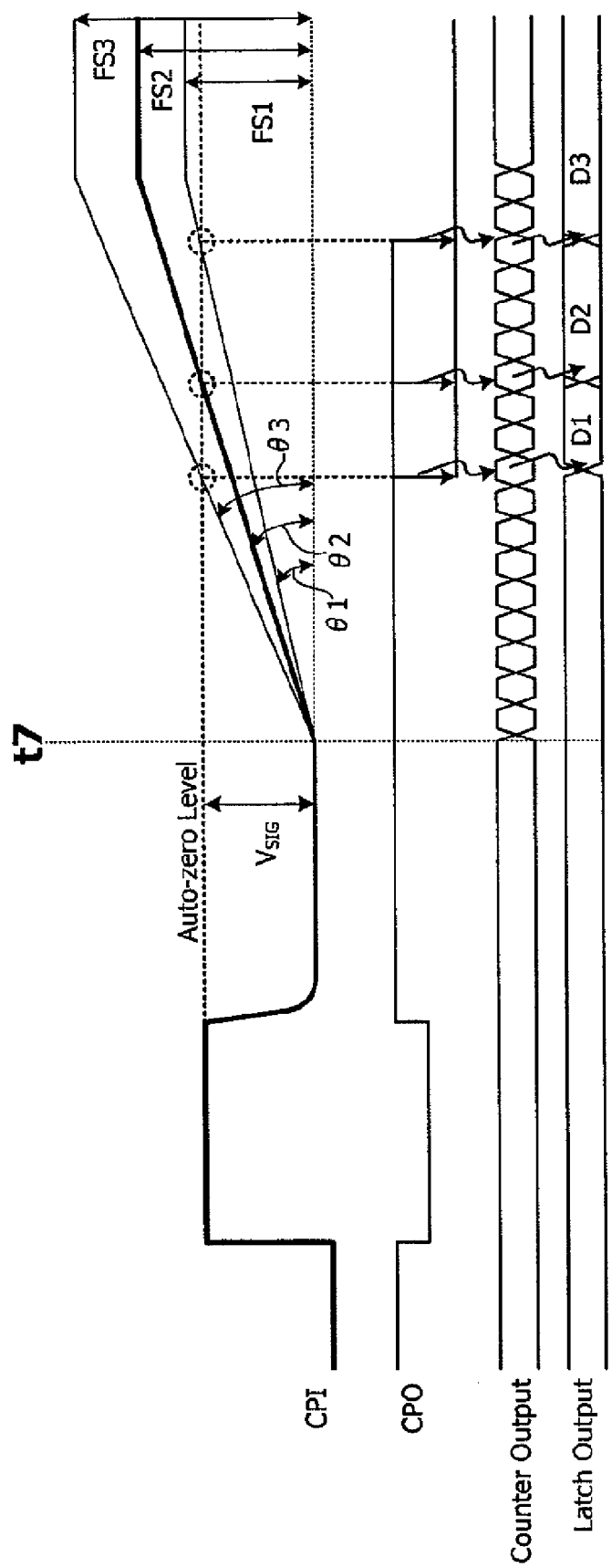
FIG. 15 is a graph showing an A/D conversion result when A/D conversion is performed with the ramp voltage from the ramp voltage generation circuit having a variation in inclined angle θ.

Here, according to the formula 12, the full scale voltage $V_{FS}$ depends on the ratio between the sample and hold capacitor Cs and the capacitive load Cint for generating the ramp voltage, and the value of the voltage $V_{REF}$, and the inclined angle θ is determined based on the full scale voltage $V_{FS}$ and a time Tint (Tint_1 and Tint_2) taken for the counter to count to the bit precision N. Furthermore, the time Tint depends on the counter clock frequency. Therefore, when the either the ratio between the sample and hold capacitor Cs and the capacitive load Cint for generating the ramp voltage or the value of the constant voltage $V_{REF}$ generated from the stabilization voltage source Vref or both of them are changed according to the counter clock frequency, the inclined angle θ can be controlled. When the inclined angle θ can be arbitrarily controlled, as shown in FIG. 15, for example, the full scale voltage $V_{FS}$ can be changed to FS1 to FS3 according to the change of the inclined angles θ1 to θ3. At this time, the A/D conversion result is change to D1 to D3. This means that a gain can be set for the A/D conversion result for a certain analog voltage $V_{SIG}$ by controlling the inclined angle θ.

According to the conventional constitution, the problem is that the A/D conversion result for the same object differs among products because the inclined angle θ is varied among chips due to the element variation among wafers or lots. However, unlike the above case, as described in the above first to third embodiments, the constitution of this embodiment is characterized in that on the condition that the same digital conversion value can be generated for the same analog value, a gain can be set to the converted value by controlling the inclined angle θ. Therefore, according to the circuit 1b of the present invention according to this embodiment, when each value of the $V_{REF}$, Cs and Cint is changed according to the gain determined according to an imaging mode, the A/D conversion operation multiplied by the certain gain to the analog voltage $V_{SIG}$ can be implemented.

In addition, the description has been made of measures to prevent the fluctuation of the inclined angle θ to perform the stable A/D conversion operation in the above first and second embodiments. According to this embodiment, although the inclined angle θ is changed, since the inclined angle θ determined based on the value of the counter clock frequency needs to be stable, this embodiment is not different in idea from the first or second embodiment. That is, this embodiment is characterized in that the inclined angle θ can be changed according to the circumstances in addition to the constitution of the first or second embodiment.

According to the above constitution, when an imaging device is provided with the device of the present invention according to this embodiment, the gain can be set according to the brightness of the object such that when the object is dark, the gain is set high and when the object is bright, the gain is set low. Thus, a preferable digital image can be generated according to the brightness of the object (that is, according to the frame rate).

In addition, although each value of $V_{REF}$, Cs, and Cint can be changed in this embodiment, a constitution in which at least one of them can be changed may be employed. Furthermore, according to the circuit 1b of the present invention shown in FIG. 9, although each value of $V_{REF}$, Cs and Cint can be changed in the circuit 1a of the present invention according to the second embodiment, each value of $V_{REF}$, Cs and Cint may be changed in the circuit 1 of the present invention according to the first embodiment.

Another embodiment

Another embodiment will be described hereinafter.

Figure 10:
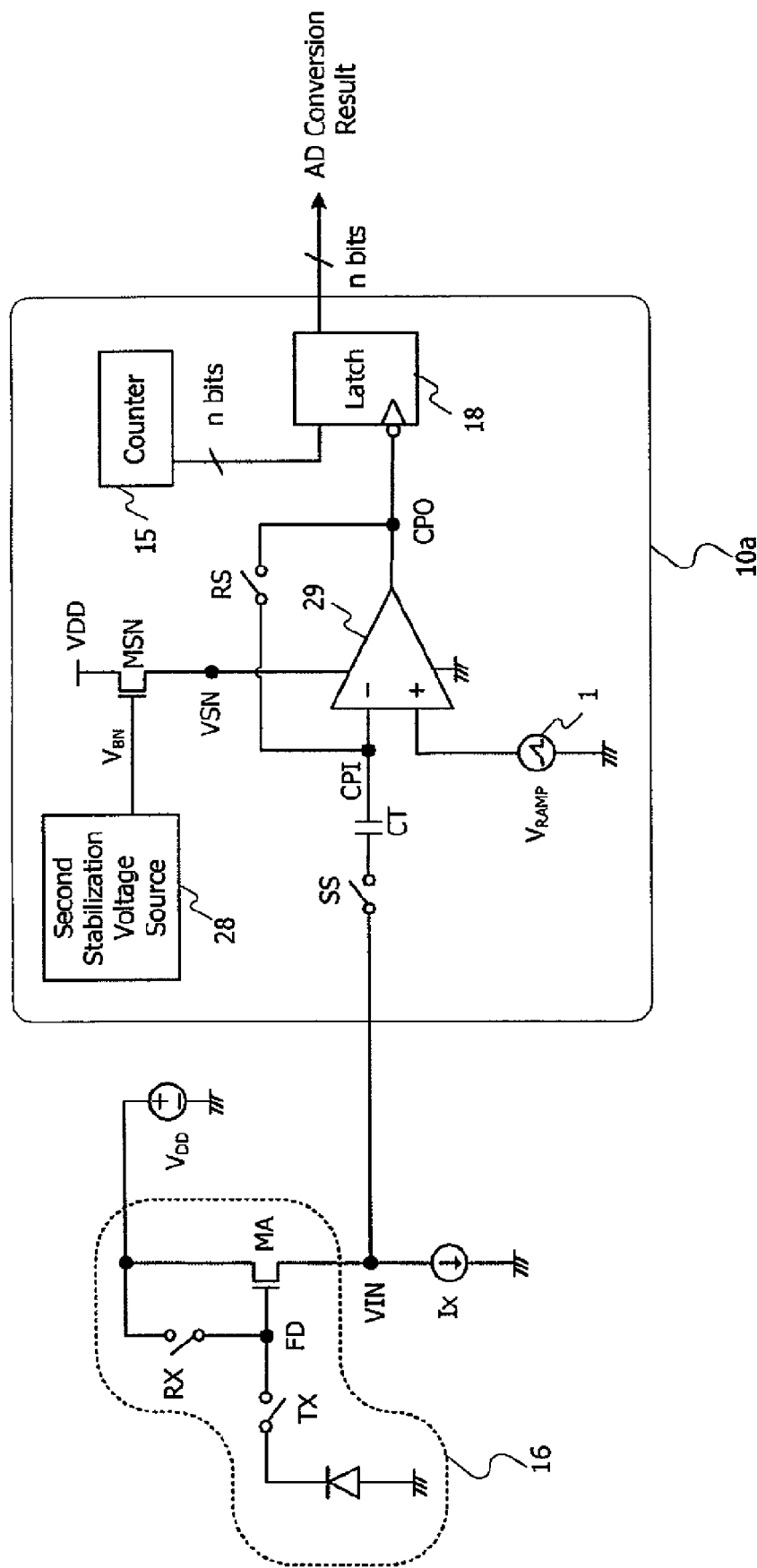
FIG. 10 is a circuit block diagram showing a schematic constitution of another embodiment of an A/D converter according to the present invention.
Figure 11:
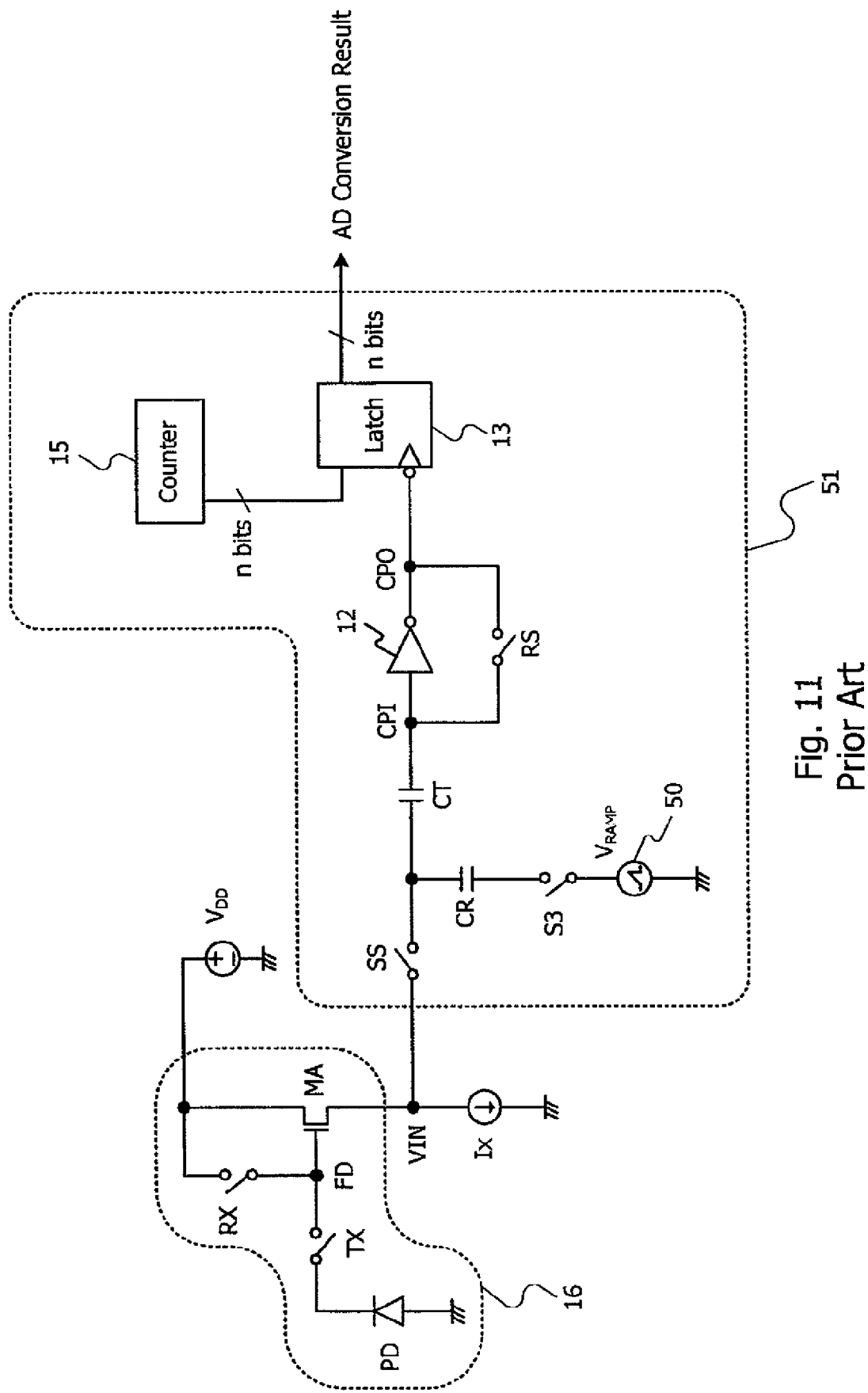
FIG. 11 is a circuit block diagram showing a schematic constitution of a conventional column-type A/D converter.

(1) Although the inverter circuit 12 is used as an arithmetic unit used for comparing the reference voltage with the analog voltage to be converted in the device of the present invention according to each embodiment, a differential amplifier may be used as shown in FIG. 10.

That is, a device 10a of the present invention shown in FIG. 10 comprises an operation amplifier 29 instead of the inverter circuit 12 as compared with the device 10 of the present invention shown in FIG. 1 and further comprises a second stabilization voltage source 28 to apply a drive voltage to the operation amplifier 29 and a transistor MSN. According to the constitution of the device 10a of the present invention, since the reference voltage can be directly supplied to a non-inversion input node of the operation amplifier 29, the switch S3 and capacitor CR (refer to FIG. 1) needed for transmitting the reference voltage to the input node CPI in each of the above embodiments can be omitted. Therefore, according to the constitution of this circuit, a circuit area can be reduced.

In addition, since the operation amplifier 29 has high power supply rejection ratio (PSRR) as compared with the inverter circuit 12, when the operation amplifier 29 is used as the arithmetic unit for comparing the voltages instead of the inverter circuit 12, voltage fluctuation of a system power supply voltage VDD is prevented from affecting the A/D conversion result.

(2) Although a description has been made assuming that the ramp voltage generated from the ramp voltage generation circuit according to the present invention shows a voltage waveform increasing with time in each of the above embodiments, when each voltage polarity is reversed, the A/D conversion can be performed using a ramp voltage showing a voltage waveform decreasing a voltage value with time by the same method. In this case, in FIG. 12 the voltage of the node CPI is reduced to the auto-zero level at the timing t1 and the voltage based on the photoelectric conversion amount is applied to the node CPI at the timing t4, so that the voltage of the node CPI is increased by the voltage based on the photoelectric conversion amount. Then, the ramp voltage is applied at the timing t7 and the number of counter clock signals counted by the counter 15 until the time the voltage of the node CPI reaches the auto-zero level is outputted as digital data.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is
1. An A/D converter comprising:
  a ramp voltage generation circuit, comprising:
    a capacitive load to be charged and discharged based on a constant current generated from a constant current source, comprising:
      a constant voltage source; and
      a resistive load converting a voltage generated from the constant voltage source to a constant current contributing to charge and discharge of a capacitive load, wherein the resistive load comprises a switched capacitor,
    wherein a ramp voltage is generated based on an output at one end of the capacitive load;
  a voltage comparison circuit sampling and holding one or more analog voltages to be converted, and comparing the sampled and held one or more analog voltages to be converted with a reference voltage given by a voltage change value of the ramp voltage generated from the ramp voltage generation circuit or a voltage value proportional to the voltage change value by an arithmetic unit, and changing its output when the reference voltage equals the analog voltage to be converted;
  a counter counting a digital value according to the reference voltage and outputting the digital value; and
  a latch circuit latching the digital value outputted from the counter and outputting the latched digital value when the output of the voltage comparison circuit is changed,
  wherein a ratio between a frequency of a sampling clock signal used in the switched capacitor in the ramp voltage generation circuit and a frequency of a counter clock signal used in the counter is kept constant.

2. The constant current source according to claim 1, further comprising:
  a capacitive component connected to the switched capacitor in parallel to stabilize a current conversion operation by the switched capacitor.

3. The ramp voltage generation circuit according to claim 1, wherein
  an inclination of the generated ramp voltage can be controlled by changing any one of a voltage value generated from the constant voltage source, an equivalent resistance value of the switched capacitor and a capacitance value of the capacitive load.

4. The A/D converter according to claim 1, wherein
the arithmetic unit comprises an inverter circuit and
a voltage synthesis circuit to generate a composite voltage provided by adding a differential voltage between the analog voltage to be converted and the reference voltage, to an input determination voltage of the inverter circuit, as an input voltage of the inverter circuit.

5. The A/D converter according to claim 1, wherein
the arithmetic unit comprises a differential input type of operation amplifier receiving the analog voltage to be converted and the ramp voltage as input voltages.

6. The A/D converter according to claim 1, wherein
a gain can be set for the digital value converted from the analog voltage to be converted by controlling an inclination of the ramp voltage generated from the ramp voltage generation circuit.

7. An A/D converter comprising:
  a ramp voltage generation circuit, comprising:
    a capacitive load to be charged and discharged based on a constant current generated from a constant current source, comprising:
      a constant voltage source; and
      a resistive load converting a voltage generated from the constant voltage source to a constant current contributing to charge and discharge of a capacitive load, wherein the resistive load comprises a switched capacitor,
    wherein a ramp voltage is generated based on an output at one end of the capacitive load;
  a voltage comparison circuit sampling and holding one or more analog voltages to be converted, and comparing the sampled and held one or more analog voltages to be converted with a reference voltage given by a voltage change value of the ramp voltage generated from the ramp voltage generation circuit or a voltage value proportional to the voltage change value by an arithmetic unit, and changing its output when the reference voltage equals the analog voltage to be converted;
  a counter counting a digital value according to the reference voltage and outputting the digital value; and
  a latch circuit latching the digital value outputted from the counter and outputting the latched digital value when the output of the voltage comparison circuit is changed,
  wherein the arithmetic unit comprises an inverter circuit and a voltage synthesis circuit to generate a composite voltage provided by adding a differential voltage between the analog voltage to be converted and the reference voltage, to an input determination voltage of the inverter circuit, as an input voltage of the inverter circuit.

8. An A/D converter comprising:
  a ramp voltage generation circuit, comprising:
    a capacitive load to be charged and discharged based on a constant current generated from a constant current source, comprising:
      a constant voltage source; and
      a resistive load converting a voltage generated from the constant voltage source to a constant current contributing to charge and discharge of a capacitive load, wherein the resistive load comprises a switched capacitor,
    wherein a ramp voltage is generated based on an output at one end of the capacitive load;
  a voltage comparison circuit sampling and holding one or more analog voltages to be converted, and comparing the sampled and held one or more analog voltages to be converted with a reference voltage given by a voltage change value of the ramp voltage generated from the ramp voltage generation circuit or a voltage value proportional to the voltage change value by an arithmetic unit, and changing its output when the reference voltage equals the analog voltage to be converted;
  a counter counting a digital value according to the reference voltage and outputting the digital value; and a latch circuit latching the digital value outputted from the counter and outputting the latched digital value when the output of the voltage comparison circuit is changed, wherein a gain can be set for the digital value converted from the analog voltage to be converted by controlling an inclination of the ramp voltage generated from the ramp voltage generation circuit.

* * * * *